(12) United States Patent
Minghetti

(10) Patent No.: US 6,177,499 B1
(45) Date of Patent: Jan. 23, 2001

(54) ACRYLIC SHEET HAVING UNIFORM DISTRIBUTION OF COLOR AND MINERAL FILLER BEFORE AND AFTER THERMOFORMING

(75) Inventor: Ettore Minghetti, Boone County, KY (US)

(73) Assignee: Aristech Acrylics LLC, Florence, KY (US)

( * ) Notice: Under 35 U.S.C. 154(b), the term of this patent shall be extended for 0 days.

(21) Appl. No.: 09/266,185

(22) Filed: Mar. 10, 1999

Related U.S. Application Data

(60) Division of application No. 08/888,958, filed on Jul. 7, 1997, now Pat. No. 5,985,972, which is a continuation-in-part of application No. 08/740,380, filed on Oct. 29, 1996, which is a continuation-in-part of application No. 08/720,164, filed on Sep. 25, 1996, now Pat. No. 5,705,552, which is a continuation-in-part of application No. 08/620,510, filed on Mar. 22, 1996, now Pat. No. 5,567,745, which is a division of application No. 08/392,650, filed on Feb. 23, 1995, now Pat. No. 5,521,243, which is a continuation-in-part of application No. 08/157,253, filed on Nov. 26, 1993, now abandoned.

(51) Int. Cl.$^7$ ................................ C08J 5/10; C08K 3/10; C08L 33/12
(52) U.S. Cl. ............................................. 524/437; 524/430
(58) Field of Search .................................. 524/437, 430, 524/560, 786, 853

(56) References Cited

U.S. PATENT DOCUMENTS

| | | | |
|---|---|---|---|
| 3,563,939 | * | 2/1971 | Stevens et al. ........................... 260/37 |
| 3,847,865 | * | 11/1974 | Duggins et al. ................... 260/42.52 |
| 4,085,246 | * | 4/1978 | Buser et al. ........................... 428/220 |
| 4,159,301 | * | 6/1979 | Buser et al. ........................... 264/331 |
| 4,413,089 | * | 11/1983 | Gavin et al. ........................... 524/785 |

FOREIGN PATENT DOCUMENTS

916337  *  12/1972  (CA).

* cited by examiner

Primary Examiner—James J. Seidleck
Assistant Examiner—U. K. Rajguru
(74) Attorney, Agent, or Firm—Thorpe Reed & Armstrong LLP

(57) ABSTRACT

The present invention is drawn to a composition and thermoformable sheets and articles made therefrom. In the present invention, ranges of chain-transfer agents, thixotropic agents, and mineral filler content are balanced to minimize migration or maldistribution of coloring matter and mineral filler during curing of methyl methacrylate in a syrup and also during subsequent heating and deformation in thermoforming, to achieve constancy of impact resistance and improve stability of patterns even in deformed portions of formed sheets.

17 Claims, 1 Drawing Sheet

ACRYLIC SHEET HAVING UNIFORM DISTRIBUTION OF COLOR AND MINERAL FILLER BEFORE AND AFTER THERMOFORMING

RELATED APPLICATION

This application is a divisional of application Ser. No. 08/888,958, filed Jul. 7, 1997, U.S. Pat. No. 5,985,972 which is a continuation-in-part of our application of the same title, Ser. No. 08/740,380, filed Oct. 29, 1996, U.S. Pat. No. 5,932,061 which is a continuation-in-part of Ser. No. 08/720,164, filed Sep. 25, 1996, U.S. Pat. No. 5,705,552, which is a continuation-in-part of Ser. No. 08/620,510 filed Mar. 22, 1996, U.S. Pat. No. 5,567,745, which is a Divisional of application Ser. No. 08/392,650, filed Feb. 23, 1995, U.S. Pat. No. 5,521,243, which is a continuation-in-part of Ser. No. 08/157,253, filed Nov. 26, 1993, now abandoned.

TECHNICAL FIELD

This invention relates to the manufacture of acrylic sheet or slabs, that is sheets or slabs of polymethylmethacrylate ("PMMA"), of the type usable in or designed for architectural uses such as kitchen countertops and more complex shapes. The sheets or slabs contain significant amounts of flame retardant minerals, typically alumina trihydrate, and almost always have colorants in them, frequently in imitation of natural minerals such as onyx, marble or similar synthetic appearing solid color or patterned types having no visibly distinguishable particles. This invention describes a sheet that can be heated and bent at a sharp 90° angle and/or that can be heated and vacuum formed into shapes like sinks and bowls without a significant esthetic sacrifice. In addition, the sheets or slabs of this invention display specific physical and other properties, like low flammability and minimal color changes after thermoforming; the uniform distribution of flame retardant significantly improves the consistency of impact resistance.

BACKGROUND OF THE INVENTION

Sheets and slabs of synthetic mineral appearing material are now commonly used as kitchen countertops and interior and exterior decorative coverings of all kinds for buildings such as banks, air terminals, stores, and the like. Such applications frequently require that the material be fabricated to fit custom designed areas, requiring in turn that the slabs or sheets be butted together or otherwise joined in ways that juxtapose a cross section with a normal surface at 90°.

The fabrication process requires extensive time and specially trained craftsmen to be completed successfully, since special tools and procedures are necessary. If a shaped, one piece part of continuous or monolithic material is desired, such a part can only be produced by casting it in a mold cavity under special conditions. In addition to the high costs of such a process and for the installation of the parts (fitting, gluing it in place to a flat sheet, and/or finishing, for example,) there are often color differences between the cast bowl, for example, and the flat slab of the same material.

The sheet (the terms "sheet" and "slab" will be used interchangeably herein) of our invention can provide a relatively complex finished part by a simple thermoforming operation—that is, the sheet is heated and then pulled by vacuum into a concave cavity (or convex) mold, where it is allowed to cool, to retain its new shape. Such a mold can be shaped as a vanity top, with one 90° back splash wall, with a front end bull nose of 1.0 inch radius and a vanity type bowl. After forming, cooling and trimming, the part can be installed directly in place, without additional fabrication required.

Only one contemporary commercial product (Corian® by DuPont) is said to be capable of being heat bent. However, its performance is not suitable, for example, to make 90° angle back splash wall, since the minimum radius of curvature specified by the Corian literature of which we are aware is 3.0 inches.

So far as we are aware, the use of alumina trihydrate in polymethylmethacrylate ("PMMA") articles was first proposed by Stevens et al in U.S. Pat. No. 3,563,939 (col. 4, lines 28–29) and Duggins in Canadian Patent 916,337. Its flame retardant properties are now well known and accepted, and alumina trihydrate ("ATH") is now widely used as a filler in various resinuous products. Somewhat more detail for the construction of synthetic mineral products is provided by Duggins in U.S. Pat. No. 3,847,865; crosslinking agents are mentioned, for example. Also proposed are mold release agents, and viscosity reducers such as aliphatic acids.

Buser et al, in U.S. Pat. Nos. 4,085,246 and 4,159,301 address the problem of the settling rates of various particles used in making a simulated granite having a matrix of polymerizable methyl methacrylate ("MMA") having PMMA dissolved in it. See column 7, lines 42–62 of the '301 patent. They use the PMMA to adjust viscosity, which in turn controls the settling rates of the larger particles—see the Examples, particularly Example 5 of U.S. Pat. No. 4,159,301, lines 31–34. They also use chain-transfer agents as accelerators for the polymerization—col. 8, lines 58–68 of the same patent.

Uniformity of color is mentioned as a goal in Gavin et al U.S. Pat. No. 4,413,089, wherein iron oxide pigment of 10 microns or less is uniformly distributed in a syrup of MMA/PMMA which is then cured; prolonged storage of the syrup is not recommended (col. 2, lines 50–64).

In addition to meeting the above-described challenges, a material destined for use as a kitchen countertop, for example, should have a surface which is easily repairable and restored to its original appearance, such as by sanding and polishing, be protected against flammability, and have good temperature resistance in spite of being thermoformable.

The prior art has more or less neglected the goal of thermoformability or thermobending of solid surface sheets, since the prior art products were generally designed for reproducing the look of flat, natural, mineral based sheets.

SUMMARY OF THE INVENTION

Figure 1A:
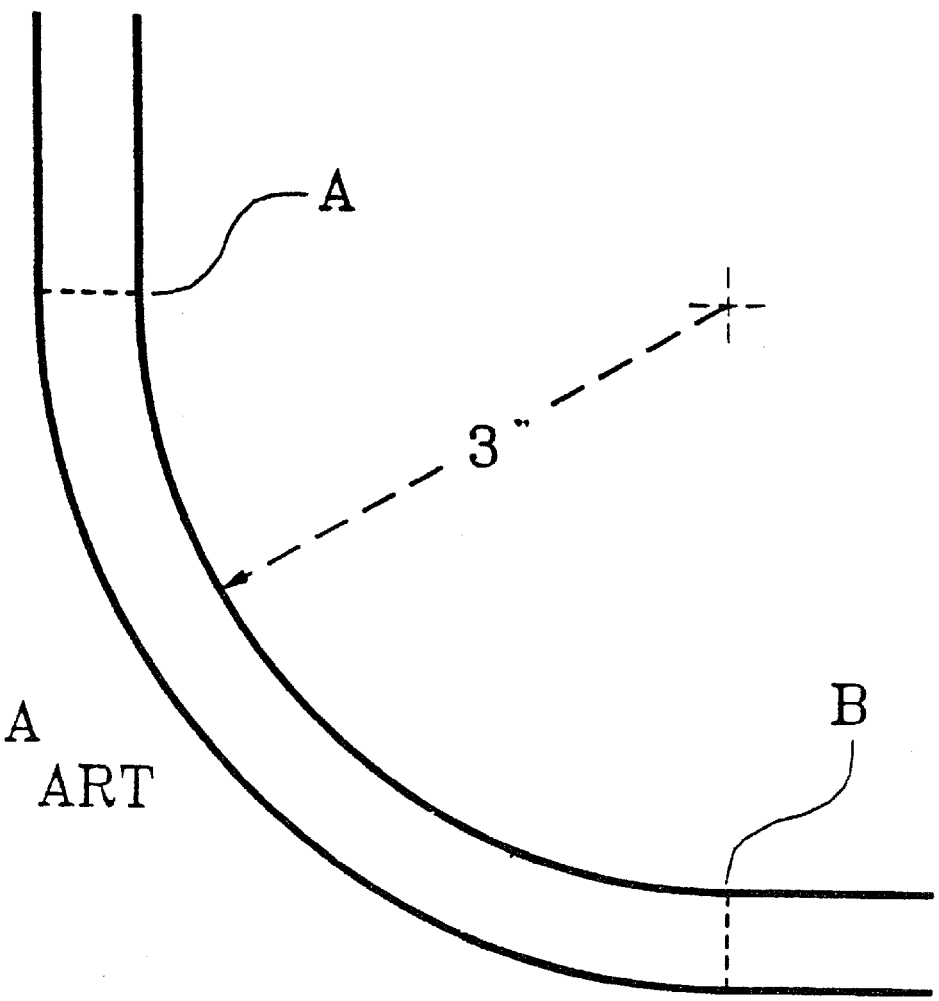
FIG. 1A is a more or less hypothetical illustration of a prior art bending of a sheet of "Corian" one-half inch thick.

The present invention addresses the making of mineral filled PMMA sheets that:
- can be heat bent at relatively sharp angles,
- can be thermoformed into shaped articles without losing the uniform appearance without losing the uniform appearance and properties of the top surface,
- can be thermoformed by vacuum into a single-profile mold, concave or convex, and do not require two matching molds, have only minor and tolerable color changes across the whole finished part, either less than Delta E=2.0 by Cielab or not easily discernible by the human eye, have a thermoforming temperature low enough to avoid any significant loss of water from ATH filler during thermoforming, as is often the case for other thermoplastic materials, have a Flame Spread Index, by the ASTM E-84 Tunnel Test, lower than 75 and a Smoke Index of 350 or less, have the same impact resistance, by a falling weight method, measured from both the top side and the bottom side.

Our invention provides for the stability of the suspension of alumina trihydrate, or other mineral filler, in a syrup of methyl methacrylate having polymethylmethacrylate dissolved in it by maintaining the following ingredients within the indicated ranges (by weight):

Content of PMMA dissolved in MMA/other monomers: 0–30% weight, preferably 10–25%.

ATH in the entire composition: 20–60% by weight, preferably 25–40%.

Thixotropic agent (preferably fumed silica) in the monomer/syrup fraction of the mixture:

0.10–3.5% or as much as necessary to obtain a viscosity of 1,000–10,000 centipoise (preferably about 2,000–5,000 centipoise) after mixing and measured by Brookfield Viscometer Model RVTDV-II, Spindle No. 2, 10 RPM.

Crosslinking agent as % weight of the total monomers content: greater than 1%, and up to about 12%.

Chain-transfer agent as % weight of the total monomers content as it relates to the amount of crosslinking agent "x": when $1<x\leq6$, $0.01\leq y\leq(1.07x+0.3)$, and when $6<x\leq12$, $7.0\geq y\geq(0.545x-3.23)$, when using n-dodecyl mercaptan. A convenient way to compare the effects of chain-transfer agents is to compare molecular weights obtained by polymerizing MMA in the presence of the chain-transfer agent and the absence of crosslinkers. The $MW_w$ and $MW_n$ should be similar to that obtained by n-dodecyl mercaptan.

In addition to the above-identified ingredients, dyes and pigments may be present, polymerization initiators will be necessary, and other conventional ingredients may be used as are known in the art.

However, we do not employ particulates which are visibly distinguishable in the finished product. Most synthetic granites contain visibly distinguishable particles of various compositions and colors ranging from about 150 to 500 microns—that is, they will pass through a sieve having openings of 500 microns and be retained on one having openings of 150 microns (although larger particles are not uncommon in the synthetic mineral art). We have found that our objective of even distribution of particles can be frustrated through the use of such larger particles of various compositions, and accordingly, we restrict our particle size to particles smaller than those which will be retained on a sieve having openings of 90 microns, and preferably smaller than those which will be retained on a sieve having openings of 60 microns. These specifications for particle size apply in our invention to particulates of any composition of functional-mineral flame retardants such as ATH, for example, or synthetic resin or other fillers.

The above-listed ingredients may be further described as follows:

PMMA as used herein is polymethylmethacrylate having a (weight average) molecular weight range of about 30,000 to about 600,000 having no cross linked polymer chains, in order to remain soluble in MMA. It is typically made in situ by partial polymerization of methyl methacrylate, but can be pre-polymerized and dissolved in the MMA.

MMA is methyl methacrylate. The syrup is described herein as comprising PMMA dissolved in monomers comprising at least about 60% MMA, and preferably at least about 80% MMA, but of course the crosslinking agent, chain terminator, initiator, and thixotropic agent are also present in the amounts indicated herein as well as variable amounts of dyes and/or pigments; in addition, amounts of other, optional, copolymerizable monomers, notably butyl acrylate, may be present in the syrup as is known in the art. We prefer to use a syrup which contains about 15% to about 25% PMMA. References to syrup herein and to MMA should be understood possibly to include such additional materials.

Alumina trihydrate is well known in the art of synthetic mineral manufacture. In the examples, we used it in a particulate size range of about 9 microns average, but the particulate size may vary widely. As noted above, the ATH as well as any other particles which are potentially visually distinguishable (if large enough) in the finished product should be able to pass through a sieve having openings of 90 microns, and preferably will pass through a sieve having openings of 60 microns, in order to assure that they will not be visually distinguishable. In quantity, the ATH may vary from about 20% to about 60% weight (preferably 25% to 50%) of the finished product.

Our invention contemplates a solid surface material in which may be seen the effects of the particulates no greater than 90 microns across. Our material is not simulative of granite, in that it is not coarse-grained, as granite is sometimes described. Rather, if the effects of the particulates in our material can be discerned at all, it may be described as substantially fine-grained (which we define specifically as having grains or particles less than 90 microns—that is, having no individually visibly discernable particles greater than 90 microns). We intend for the term "substantially fine-grained" to include materials in which no grains or particles are individually visibly discernable.

Any number of crosslinking agents, di-functional or tri-functional, may be used. Examples for suitable crosslinkers are ethylene glycol dimethyl acrylate, propylene dimethyl acrylate, polyethylene-glycol diemethylacrylate, propylene dimethyl acrylate, polyethylene-glycol dimethylacryalate, divinyl benzene, diallyl phthalate, 1,3-butanediolmethacrylate, 1,4-butane ethylene glycol dimethacrylate or neopentyl glycol dimethacrylate as di-functional crosslinkers and trimethylol propane trimethacrylate, triallyl cyanurate, pentaerythritol tetramethacrylate, allylmethacrylate, hydroxyethylmethacrylate or hydroxypropylmethacrylate as tri-functional crosslinkers. Most suitably, ethylene glycol dimethacrylate is preferred. The crosslinking agents are maintained in concentrations of greater than 1.0. Preferably, 1.0 to about 12.0 pph of di-functional crosslinkers based on the MMA in the syrup, or, as a component of the finished product, based on the crosslinked polymer. Most preferably, the content is $6.0\geq x>1.0$. The combination of crosslinking agent and chain termination in the appropriate amounts assures the appropriate polymeric network most amenable to thermoformability.

Chain terminators or chain-transfer agents, such as octyl mercaptan, iso-dodecyl mercaptan, thiurams, dithiocarbarumates, dipentene dimercaptan, 2-mercapts ethanol, allyl mercapts-acetates, ethylene glycol dimercaptsacetate, trimethylolethane trithioglycolate, pentaerythritol tetrathioglycolate, normally serve the function of regulating the molecular weight of the polymerizing MMA, which in turn is known to affect the plastic behavior of polymerized mixture. In accordance with our method, chain terminators or chain-transfer agents are used to regulate the length of the polymer chains and thus to obtain the most suitable polymer matrix for thermoformability, as will be seen by the data in Example 3. They should be used in preferred amounts from 0.01 to about 7.0 pph of the total monomers present when using n-dodecyl mercaptan. Most preferably, $0.01 \leq y \leq (1.07x+0.3)$.

While we may use a conventional thickening agent as well as a thixotropic agent, the thixotropic agents we use are shown herein to be particularly suited for present purposes. They appear to enhance the inertial tendency of a particle to remain stationary in the matrix suspension. We prefer to use fumed silica. By fumed silica we identify the product formed by the hydrolysis of silicon tetrachloride vapor in a flame of hydrogen and oxygen, to produce solid particles in the range 7–30 millimicrons. Many different types of fumed silica are available. To conduct the bulk of our experimentation, we selected CAB-O-Sil M5, which has a surface area of 200 sq.meter/gram. However, any conventional fumed silica will have a beneficial effect in our invention.

The surface of fumed silica is hydrophilic since it has an abundance of hydroxyl groups, which makes it capable of hydrogen bonding with suitable molecules. Absorbed moisture in the silica or in the other components has a gross effect on the final viscosity of suspensions containing fumed silica and normally it lowers it. The same effect is given by other substances which may be more or less capable of developing hydrogen bonding.

If the fumed silica and/or the ATH are dried to eliminate the absorbed moisture, the final viscosity of the suspension will be higher than when using the commercial products directly from the containers in which they are sold. Drying of the ATH above 200° F. may defeat its primary utility as a flame retardant by depleting its water content.

In our preferred compositions, the amount of fumed silica is selected so that the preferred viscosity is obtained, regardless of variations in the other ingredients.

The preferred method of obtaining a desired viscosity is the following:

A. Mix all the ingredients (MMA, PMMA, ATH, pigments, other additives, catalysts, chain-transfer agent, and crosslinking agent) of the formulation except the fumed silica and measure the viscosity as indicated below. If necessary, adjust the MMA (monomer) content of the syrup to obtain a viscosity of 800 to 1,500 centipoise.

B. Repeat step A including an amount of fumed silica and measure the viscosity.

C. Repeat step B to bring the viscosity to a level between 1,000 and 10,000 centipoise, preferably between 2,000 and 5,000 centipoise.

As indicated previously, the stability of our syrup is considered important, and this is especially so where the sheet or slab is formed in a continuous steel belt forming machine such as described in Hellsund's U.S. Pat. No. 3,371,383 and Opel's U.S. Pat. No. 3,376,371, both of which are incorporated herein by reference in their entireties, as these references represent our preferred procedure. While the forming of sheets or slabs between two moving continuous steel belts is the preferred procedure, it is important to realize that such machines are necessarily prone to vibration and microadjustments which tend to result in an almost unavoidable jostling of the particulates in the syrup; the concentrations of crosslinker, chain terminator, fumed silica, and PMMA prepolymer are important in stabilizing the ATH and/or other solids contributing to an evenly distributed fine-grained appearance.

DETAILED DESCRIPTION OF THE INVENTION

Referring to FIG. 1A, the recommended (DuPont Corian Technical Bulletin CTDC-110, October, 1987) minimum bending radius of three inches for a prior art one-half inch thick flat sheet is illustrated as the radius of the bend in the inside curve from vertical extension point A to horizontal extension point B. Applying the simple formula C=IID, the circumference of a hypothetical three-inch circle would be 18.8496 inches, and the quarter circle AB would measure 4.7124 inches. Applying the same formula to the outside curve for a sheet 0.5 inch thick, i.e. using a radius of 3.5, yields a quarter circle of 5.4953, a difference of 16.6% from the inside curvature. Such a distortion will tend to cause a flow of heated ingredients from the compressed inside curve to the expanded outside, and lengthwise toward points A and B from the curved portion. The flow of ingredients has a tendency to distort the visual or decorative pattern; accordingly, the prior art has minimized the disruptions of the material by using a relatively large radius for the curvature, e.g. 3 inches.

Figure 1B:
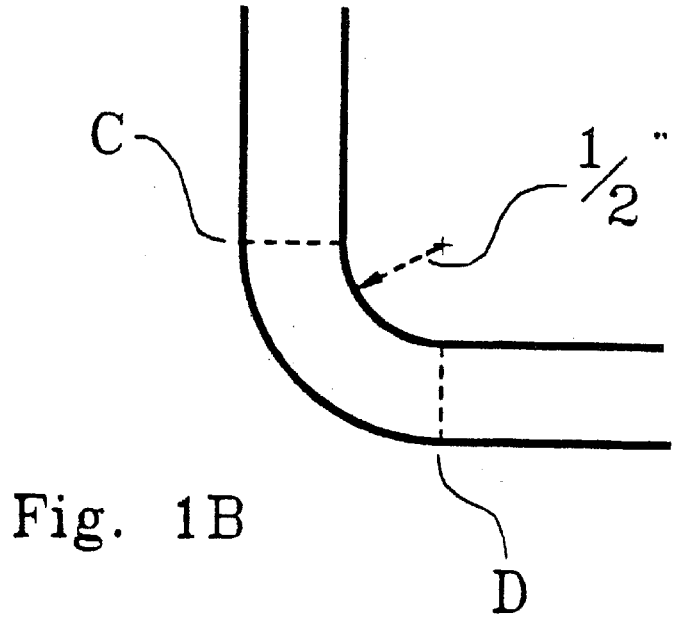
FIG. 1B is a similar idealized illustration of the bending of a sheet of the present invention.

FIG. 1B illustrates the achievable curvature of a sheet of the present invention, wherein the radius of the curve is one-half inch rather than the three inches of the section of FIG. 1A. In this case, the theoretical circumference of the outside of the curved section CD is 100% greater than that of the inside of the curve. It is readily seen that by enabling such a forming ability, the present invention overcomes a more severe displacement of material in relatively less volume. The relatively more severe displacement of material means a greater potential for distortion of the esthetic pattern, but we avoid or neutralize such distortion and so achieve a continuity of pattern heretofore not achievable under the stress of thermoforming.

A test has been devised to evaluate thermobformability, which is a primary object of the present invention. The test consists of clamping a flat test specimen 4⅞" square having the desired thickness onto a steel plate in which has been drilled a 3-inch diameter hole; then a polished stainless steel plunger having a one-inch radius is lowered at a rate of five inches per minute regardless of the resistance. The apparatus and sample are heated prior to the test to the desired temperature. As the plunger moves, a load cell generates a signal representing the amount of resistance in pounds, which may be recorded. At the moment the specimen ruptures, the plunger is stopped and the distance it has traveled is measured. Averaging of tests from four specimens of each sample is recommended. This test may be referred to herein as TP-0085.

EXAMPLE 1

A syrup was made by partial polymerization of MMA to obtain a viscosity of 3 Poise and a PMMA content about of 20% weight. Butyl Acrylate, Cab-O-Sil M5, Aluminum Trihydrate (ATH) were added to the syrup under agitation. Their proportions are indicated below, together with the chemicals necessary to obtain a complete polymerization and a good release from the call casting plates:

TABLE 1

| | % Weight |
|---|---|
| I-3 syrup (80% MMA) | 57.20 |
| Butyl Acrylate | 2.00 |
| Cab-O-Sil M5 | 0.53 |
| ATH | 39.92 |
| Wetting Agents | 0.35 |
| | Phr |
| Pigment Paste | As needed |
| Release Agents | As needed |
| Catalysts | As needed |
| Chain Transfer Agent | See TABLE 2 |
| Plasticizer | See TABLE 2 |

The mixture of ingredients was first agitated under vacuum for 15 minutes, to eliminate the dissolved gases and avoid bubbles in the resulting sheet. It was then used to fill a cell cast assembly, large enough to produce a sheet of approximately 12×12×0.5 inches. The curing was obtained by dipping the cell cast assembly into a 180° F. water bath for one hour, followed by one hour of post cure im an air circulated oven at 250° F. After cooling to room temperature, the cell cast assembly was opened to remove the plastic sheet, and the physical testing described in the text was performed after conditioning at room temperature.

Table 2 shows the combinations of chain transfer agent and crosslinker used and the test results.

The first group of data (PL-8, PL-11, PL-12, PL-14, PL-16, PL-19, PL-24, PL-25, PL-28 listed in Table 2 represents compositions that were thermoformed under vacuum to a much greater extent than compositions from the known art. They were also thermally stable to provide formed shapes without defects.

The second group of data (PL-10, PL-13, PL-20, PL-23) represents compositions that failed the thermal stability test at 340° F. Sample PL-23 did not show a visible evidence of failing the blister test, but specimens broken during the H.D.T. test and its stability were judged to be not completely satisfactory.

The third group of data (PL-12, PL-22, PL-27) represents formulations that provide sheets with a borderline thermoformability. PL-22 and PL-27 represent the demarcation between good formability above them and poor formability below them.

The V mold forming test referred to in Table 2 was developed to determine what type of composition would yield a sheet that was an improvement over the prior art. For example, a 12 inch×12 inch Corian sheet does not draw to any significant extent under vacuum. (Approximately 0.2 inches). Therefore, a sheet of the present invention is an improvement over the prior art if the observed draw is greater than 0.2 inches.

TABLE 2

| Sample # | $x^{(1)}$ | $y^{(1)}$ | Plast.$^{(2)}$ | HDT$^{(3)}$ F | TP-0085$^{(4)}$ in./lbs. | V Mold$^{(5)}$ in. | Blister$^{(6)}$ Temp ° F. |
|---|---|---|---|---|---|---|---|
| PL-8 | 1.44 | 1.44 | | | 5.2/112 | 2.5 | P |
| PL-11 | 2.88 | 2.88 | | | 3.6/110 | | P |
| PL-12 | 4.80 | 4.32 | | | 2.4/125 | 2.4 | P |
| PL-14 | 2.88 | 1.20 | | | 2.0/187 | | p |
| PL-16 | 2.16 | 0.48 | | | 2.1/192 | | P |
| PL-19 | 4.80 | 2.40 | | | | 1.88 | P |
| PL-24 | 6.72 | 5.76 | | 157 | 2.3/71 | | P |
| PL-25 | 8.64 | 3.84 | | 178 | 1.1/90 | | P |
| PL-28 | 11.50 | 3.00 | | 171 | 0.7/38 | | P |
| PL-10 | 1.44 | 2.40 | | | 6.9/23 | | F |
| PL-13 | 2.88 | 3.60 | | | Blistered | | F |
| PL-20 | 4.80 | 5.28 | | | 2.7/55 | | F |
| PL-23 | 7.68 | 6.72 | | F | | | P |
| PL-18 | 4.80 | 0.48 | | 197 | 1.5/148 | 0.8 | P |
| PL-22 | 6.72 | 0.96 | | | | 0.55 | P |
| PL-27 | 11.50 | 3.00 | | 187 | .54/68 | | P |

$^{(1)}$Phr. of crosslinker x and chain transfer agent y per 100 parts of monomers in Ex. 1 formulation.
$^{(2)}$Phr. of plasticizer DINP (Di-isononyl phthalate) used.
$^{(3)}$Heat distortion temperature, at 264 psi; per ASTM D-648.
$^{(4)}$Thermoforming test described in U.S. Pat. No. 5,521,243. Samples are heated for 40 minutes in an oven at 340° F. before the test is initiated.
$^{(5)}$V mold forming test.
$^{(6)}$Aristech test method; visual observations to determine if blisters were developed in a 4" × 4" sample after 40 minutes in an oven at 340° F.; P = indicates passing the test; F indicates failure.

What is claimed is:

1. A thermoformed article comprising a polymerized composition comprising prior to polymerization:

(a) a syrup having a polymerizable portion comprising methyl methacrylate, said syrup having dispersed within it x parts by weight of a crosslinking agent and y parts by weight of a chain terminator, per hundred parts by weight of the polymerizable portion, and wherein x is greater than 1.0 and up to about 12.0, and when $1.0 < x \leq 6.0$, $$0.01 \leq y \leq (1.07X + 0.3)$$

and when x>6.0, $$7.0 \geq y \geq (0.545x - 3.23);$$

and (b) a plurality of solid particles which will pass through a sieve having openings of 90 microns, said solid particles comprising about 20% to about 60%, based on the weight of the final article, of a mineral filler.

2. An article according to claim 1 wherein $1<x\leq6.0$.

3. An article according to claim 1 wherein $6.0<x\leq12.0$.

4. A thermoformed article according to claim 1 wherein said particulates will pass through a sieve having an openings of 60 microns.

5. A thermoformed article according to claim 1 wherein said mineral filler is alumina trihydrate.

6. A thermoformed article according to claim 1 wherein said syrup further comprises butyl acrylate.

7. A thermoformed article according to claim 1 wherein said syrup further comprises polymethyl methacrylate.

8. A thermoformed article according to claim 7 wherein said polymethyl methacrylate is about 15–25 wt % of said syrup.

9. A thermoformed article according to claim 1 wherein the methyl methacrylate comprises at least about 80 wt % of the syrup.

10. A thermoformable sheet comprising a polymerized composition comprising prior to polymerization:

(a) a syrup having a polymerizable portion comprising methyl methacrylate, said syrup having dispersed within it x parts by weight of a crosslinking agent and y parts by weight of a chain terminator, per hundred parts by weight of the polymerizable portion, and wherein x is greater than 1.0 and up to about 12.0, and when $1.0<x\leq6.0$, $$0.01\leq y\leq(1.07X+0.3)$$

and when x>6.0, $$7.0\geq y\geq(0.545x-3.23);$$

and (b) a plurality of solid particles which will pass through a sieve having openings of 90 microns, said solid particles comprising about 20% to about 60%, based on the weight of the sheet, of a mineral filler.

11. A thermoformable sheet according to claim 10 wherein $1.0<x\leq6.0$.

12. A thermoformable sheet according to claim 10 wherein $6.0\leq x\leq12.0$.

13. A thermoformable sheet according to claim 10 wherein said particles will pass through a sieve having openings of 60 microns.

14. A thermoformable sheet according to claim 10 wherein said mineral filler comprises alumina trihydrate.

15. A thermoformable sheet according to claim 10 wherein the syrup further comprises butyl acrylate.

16. A thermoformable sheet according to claim 10 wherein said syrup further comprises about 15–25 wt % polymethyl methacrylate.

17. A thermoformable sheet according to claim 10 wherein the syrup comprises at least about 80 wt % methyl methacrylate.

* * * * *

UNITED STATES PATENT AND TRADEMARK OFFICE
CERTIFICATE OF CORRECTION

PATENT NO. : 6,177,499 B1 Page 1 of 1
DATED : January 23, 2001
INVENTOR(S) : Ettore Minghetti It is certified that error appears in the above-identified patent and that said Letters Patent is hereby corrected as shown below:

<u>Title page,</u>
Item [54], correct the title to read -- THERMOFORMABLE ARTICLE HAVING PARTICULATES DISPERSED THEREIN --.

<u>Column 2,</u>
Line 65, delete "single profile" and insert in its place -- single-profile --

<u>Column 6,</u>
Line 43, delete "thermobformability" and insert in its place -- thermoformability --

<u>Column 9,</u>
Delete the words "methyl methacrylate" and insert in their place
-- methylmethacrylate --
Line 4, delete the word "an."

Signed and Sealed this

Tenth Day of June, 2003

JAMES E. ROGAN
*Director of the United States Patent and Trademark Office*